United States Patent
Fuchiyama et al.

(10) Patent No.: US 7,298,155 B2
(45) Date of Patent: Nov. 20, 2007

(54) PROBING APPARATUS

(75) Inventors: Seiki Fuchiyama, Kumamoto (JP); Noriyasu Kiyota, Kumamoto (JP); Akito Kishida, Hachioji (JP)

(73) Assignees: Tokyo Cathode Laboratory, Co., Ltd., Tokyo (JP); Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/330,599

(22) Filed: Jan. 11, 2006

(65) Prior Publication Data

US 2006/0152235 A1 Jul. 13, 2006

(30) Foreign Application Priority Data

Jan. 12, 2005 (JP) ............................. 2005-005611

(51) Int. Cl.
*G01R 31/02* (2006.01)
(52) U.S. Cl. ....................................... 324/754
(58) Field of Classification Search .................... None
See application file for complete search history.

(56) References Cited

U.S. PATENT DOCUMENTS

| | | | | |
|---|---|---|---|---|
| 5,321,453 A | * | 6/1994 | Mori et al. ................. | 324/754 |
| 5,459,594 A | * | 10/1995 | Nakanishi et al. .......... | 349/187 |
| 5,479,106 A | * | 12/1995 | Takahashi et al. .......... | 324/753 |
| 5,703,487 A | * | 12/1997 | Mishra ....................... | 324/456 |
| 5,835,997 A | * | 11/1998 | Yassine ...................... | 324/754 |
| 6,137,300 A | | 10/2000 | Hayashida | |
| 6,194,907 B1 | * | 2/2001 | Kanao et al. ............... | 324/760 |
| 6,492,827 B1 | * | 12/2002 | Mazur et al. ............... | 324/761 |
| 6,522,158 B1 | * | 2/2003 | Fung et al. ................. | 324/765 |
| 6,783,371 B2 | * | 8/2004 | Self et al. ................... | 439/67 |
| 6,791,350 B2 | * | 9/2004 | Taguchi ...................... | 324/770 |
| 6,828,817 B2 | * | 12/2004 | Fujita ......................... | 324/770 |
| 6,861,856 B2 | * | 3/2005 | Dunklee et al. ............ | 324/754 |
| 6,906,543 B2 | * | 6/2005 | Lou et al. ................... | 324/754 |
| 2004/0222807 A1 | * | 11/2004 | Dunklee ..................... | 324/754 |
| 2005/0110508 A1 | * | 5/2005 | Kishida ...................... | 324/754 |
| 2005/0156610 A1 | * | 7/2005 | Navratil et al. ............ | 324/754 |

FOREIGN PATENT DOCUMENTS

JP 11065475 3/1999
JP 2005156253 6/2005

* cited by examiner

*Primary Examiner*—Ernest Karlsen
*Assistant Examiner*—Richard Isla-Rodas
(74) *Attorney, Agent, or Firm*—McCarter & English, LLP

(57) ABSTRACT

A probing apparatus includes a mechanism apparatus. The mechanism apparatus includes a base body, a vibration absorber, a shifting mechanism, and a stage connected via the base body to a ground terminal. A probe, positioned over the stage, is connected to a measurement terminal of a measuring apparatus via a signal cable. The signal cable has a connecting terminal connected to the measurement terminal of the measuring apparatus. A shielding cover, positioned over a measured device on a glass substrate held on the stage, has an area not smaller than an area of the measured device and not greater than four times the area of the measured device. The shielding cover is grounded.

9 Claims, 4 Drawing Sheets

PROBING APPARATUS

CROSS-REFERENCE TO RELATED APPLICATIONS

This application claims priority to Japanese Application 2005-005611 filed Jan. 12, 2005, the contents of which are hereby expressly incorporated by reference in their entirety as part of the present disclosure.

BACKGROUND OF THE INVENTION

1. Field of the Invention

The present invention relates to a probing apparatus, and more particularly to a probing apparatus capable of probing a micro signal from a measured device disposed on an insulated substrate that mounts a plurality of devices spaced apart from each other.

2. Description of the Related Art

Production of a liquid crystal display includes patterning a plurality of transparent electrodes on a glass substrate and, if necessary, further includes forming circuit elements, such as transistors, diodes, resistors, and capacitors, on the glass substrate. In order to improve productivity, plural liquid crystal display blocks are disposed in a predetermined pattern on the same glass substrate. Forming the plural liquid crystal display blocks are performed as a single process by means of a photolithography technique or the like. For example, a square or rectangular glass substrate having one side exceeding 1 m is used. A total of 100 or more liquid crystal display blocks, each having one side of several cm, are disposed in a predetermined pattern on the glass substrate.

Inspection of a glass substrate mounting liquid crystal display elements thereon is performed with a probing apparatus and a tester, at appropriate timing, during or after production. In this case, a method similar to an IC measurement method which is well known conventionally can be used for inspecting the characteristics of a device formed on a glass substrate. More specifically, device measurement on a glass substrate requires a probing apparatus and an appropriate measuring apparatus connected to the probing apparatus. The probing apparatus includes a stage for supporting and shifting the glass substrate to an arbitrary position, a contact or non-contact probe for inputting or outputting a measurement signal to or from a measurement terminal of each display element on the glass substrate, and a connecting portion that connects the probe to a measuring unit.

The measurement performed by the probing apparatus includes, in a simple case, a test for a wiring pattern to be internal opened or internal shorted (open-short circuit test), or, in a complex case, an operation characteristic test for respective transistors and a turn-on operation test for the liquid crystal display. For example, Japanese Patent Application Laid-open No. 11-65475 discloses a probe apparatus that uses an XY stage for supporting a display panel and measures characteristics of the display panel by means of a probe.

The characteristic measurement of a device on a glass substrate, especially measurement of transistor characteristics on a liquid crystal display or measurement of holding capacitance of each pixel which provides a potential to an ITO (Indium Tin Oxide) electrode in each pixel circuit, is a low-current measurement. Therefore, if large internal (or external) noises are present, sufficient measurement accuracy will not be assured. Hence, shielding a space including both the stage and the probe is used.

However, when a large-scale glass substrate is used to form plural devices thereon as described above, a large shielding space is required to cover a moving range, or a shifting range of the stage in addition to the entire area of the glass substrate. For example, when the glass substrate is a square substrate having one side of 1 m, the stage requires a shifting range of extra 1 m in both the X and Y directions. As a whole, a required shielding area is equivalent to a square area having one side of 2 m.

As is understood from the foregoing description, according to a conventional technique, a probing apparatus for a large-scale glass substrate mounting a plurality of devices requires a further larger shielding facility. As a result, both the size and the cost of the probing apparatus inevitably increase.

SUMMARY OF THE INVENTION

In view of the above problems, an advantage of the present invention is to provide a probing apparatus that is capable of probing a micro signal from a device on a substrate without requiring a large shielding facility.

A principle of the present invention will first be described.

A probing apparatus of the present invention includes a stage for supporting an insulated substrate mounting a plurality of devices that are spaced apart from each other, and a probe for inputting or outputting a measurement signal to or from a measurement terminal of a measured device on the insulated substrate to measure the characteristics of the measured device. The probing apparatus is generally subjected to various types of noise giving adverse influences to the micro signal measurement of the measured device, which are roughly classified into three kinds: noise coming from neighboring devices; noise coming from the probing apparatus; and ambient or spatial noise coming from above the device to be measured.

The noise coming from neighboring devices to the measured device is dependent on a side surface area of the measured device opposing the neighboring devices. Meanwhile, the ambient noise coming from above is dependent on an upper surface area of the measured device mounted on the insulated substrate. In general, the upper surface of a measured device is sufficiently larger than the side surface of the measured device. Therefore, the noise coming from neighboring devices is very small as compared with the ambient noise and can be neglected.

For example, a glass substrate mounting transistors, pixels, and wiring patterns thereon is used for a liquid crystal display. And for SOI (Silicon On Insulator), an insulated substrate forming semiconductor elements thereon is used. According to a liquid crystal display, a device on a glass substrate has a thickness on the level of several μm and is accordingly very small as compared with one side of an upper rectangular surface of the device. The upper rectangular surface is on the level of several mm or several tens of mm in size of one side.

As one example, it is now supposed that the devices are disposed on a glass substrate and spaced from each other with a clearance of 5 mm. Each device is 3 μm in thickness and has an upper surface measuring 50 mm×40 mm. An area of a side surface of a measured device opposing a neighboring device is 3 μm×(peripheral length of measured device)=3 μm×180 mm. Meanwhile, an upper surface area of the measured device is 50 mm×40 mm. Apparently, the upper surface area of the measured device is very large as compared with the side surface area of the measured device opposing neighboring devices. As described above, according to a general arrangement of a plurality of devices spaced apart from each other and disposed on an insulated substrate, the thickness of each device is negligible, and accordingly the noise coming from neighboring devices to a measured device is very small as compared with the ambient noise coming from above.

Therefore, adverse effects on the micro signal measurement of a measured device can be eliminated by suppressing the noise coming from the probing apparatus and the ambient noise coming from above. To this end, the present invention provides a probing apparatus having the below-described configuration.

More specifically, in consideration that the noise coming from the probing apparatus comes from a lower side of the stage supporting the insulated substrate, grounding the stage is effective for cutting the noise. Meanwhile, a measured device can be shielded from the ambient noise coming from above by providing a shielding cover that is grounded.

According to this configuration, a measured device is interposed between two shielding members. In this case, determining the sizes of the stage and the shielding cover is a key to effectively suppress the noise entering from the gap between two shielding members. The stage and the shielding cover should have wide areas capable of sufficiently covering the measured device.

To accomplish the above and other related advantages, the present invention provides a probing apparatus for probing a micro signal from a measured device on an insulated substrate that mounts a plurality of devices spaced apart from each other. The probing apparatus of the present invention includes a stage, a probe, and a shielding cover. The stage supports a lower surface of the insulated substrate and is connected to a ground terminal. The probe inputs or outputs a measuring signal to or from a measurement terminal of the measured device. The shielding cover is positioned over an upper surface of the measured device and is connected to the ground terminal. The shielding cover has an opposed area that is not smaller than an area of the measured device on the insulated substrate and not greater than four times the area of the measured device.

Furthermore, according to the probing apparatus of the present invention, the shielding cover is preferably a conductive shielding plate having a flat surface parallel to a flat surface of the stage.

Furthermore, according to the probing apparatus of the present invention, an electric potential of the ground terminal is preferably identical with an electric potential of a metallic casing that supports a driving unit of the stage.

Furthermore, according to the probing apparatus of the present invention, the measured device is preferably a device including a transparent electrode disposed on the glass substrate. For example, the transparent electrode is an ITO electrode.

According to the above-described configuration of the present invention, the stage is maintained at the ground potential. The shielding cover having the ground potential is positioned over an upper surface of the measured device. The size of the shielding cover is not smaller than an area of the measured device and not greater than four times the area of the measured device. In other words, the size of the shielding cover is greater than or equal to an area of the measured device and smaller than or equal to the quadplex area of the measured device.

Accordingly, the ambient noise entering along the edge of the shielding cover can be effectively suppressed. No substantial effect is imparted to the measured device. One reason why limited to the four times area is as follows. In general, as is known in connection with a micro strip line or a strip line, the shielding cover should have a greater width than the width of the shielded device, and prefereably, the shielding cover should have a grounded area whose width is approximately two times the width of the shielded device. Accordingly, a practical size of the shielding cover is grater than the area of the shielded device, and preferably four times the area of a measured device. So, the size of the shielding cover is not smaller than an area of the measured device and not greater than four times the area of the measured device. In this manner, providing the shielding cover having an area of approximately up to four times large for the area of a measuring device performs sufficient effect for suppressing adverse effects of noises without requiring shielding for the entire body of the insulated substrate. Thus, the present invention enables probing of a micro signal from a device on a substrate without requiring a large-scale shielding facility.

Furthermore, according to a preferred embodiment, the shielding cover is parallel to an upper surface of the stage. In other words, the stage and the shielding cover cooperatively constitute a shielding structure consisting of parallel flat plates that are connected to the ground terminal. A measured device is disposed in the gap space between parallel flat plates. Therefore, the probing apparatus according to the present invention is of simple configuration and can sufficiently suppress adverse effects of external noises.

Furthermore, according to the preferred embodiment, an electric potential of the ground terminal is identical with an electric potential of the metallic casing that supports the driving unit of the stage. The shifting mechanism portion and the stage are maintained at the same potential (i.e., ground potential). This is effective in suppressing the noise coming from the shifting mechanism portion to the stage.

Furthermore, according to the preferred embodiment, the measured device is a device including a transparent electrode disposed on the glass substrate. Thus, the probing apparatus of the present invention can be applied to a liquid crystal display device. For example, a practical transparent electrode is an ITO electrode. Thus, the probing apparatus of the present invention can be applied to a liquid crystal display device having a general configuration.

As described above, the probing apparatus of the present invention enables probing of a micro signal from a device on a substrate without requiring a large-scale shielding facility.

The above and other advantages, features of the present invention will become more apparent from the following detailed description of an exemplary embodiment with reference to the attached drawings.

BRIEF DESCRIPTION OF THE DRAWINGS

The accompanying drawings, which are incorporated in and constitute a part of the specification, illustrate an embodiment of the invention and, together with the description, serve to explain the principles of the invention, in which.

DESCRIPTION OF PREFERRED EMBODIMENT

Figure 1A:
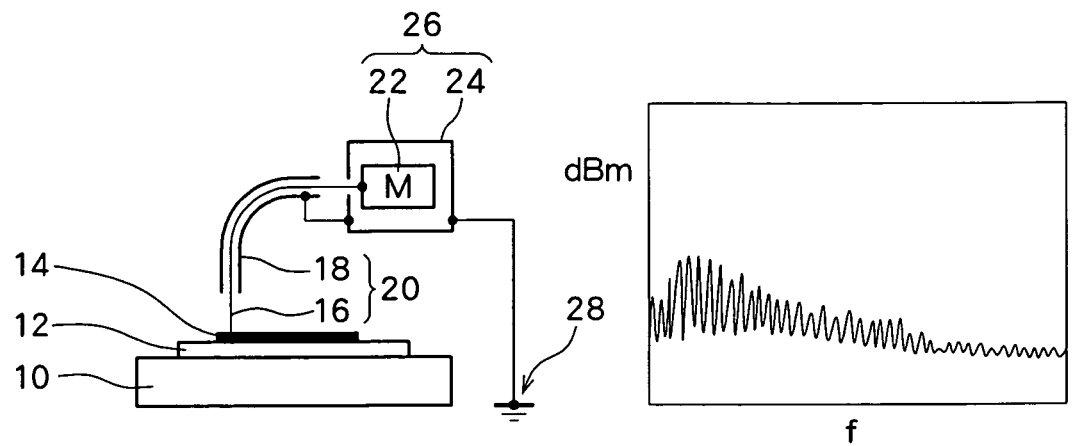
FIGS. 1A to 1C are views respectively showing a configuration of a modeling test and measured ambient noise, which explains a principle of the present invention.
Figure 1B:
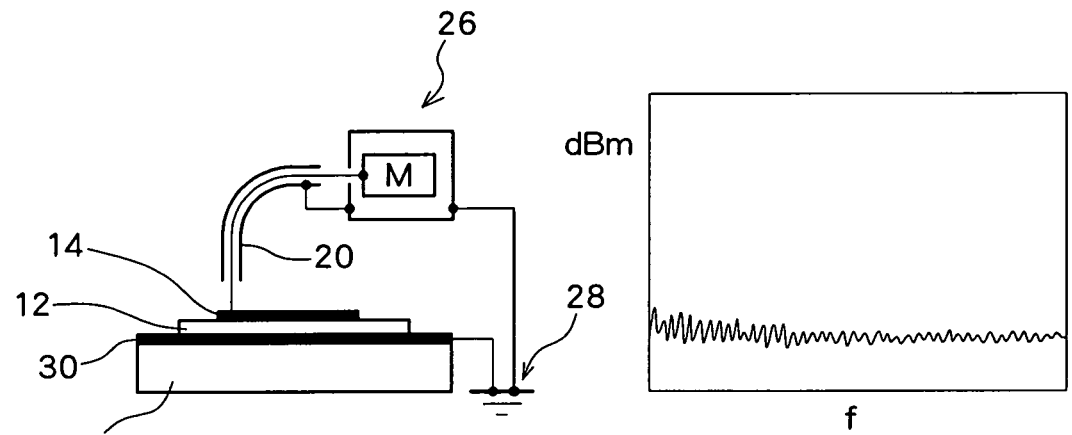
Figure 1C:
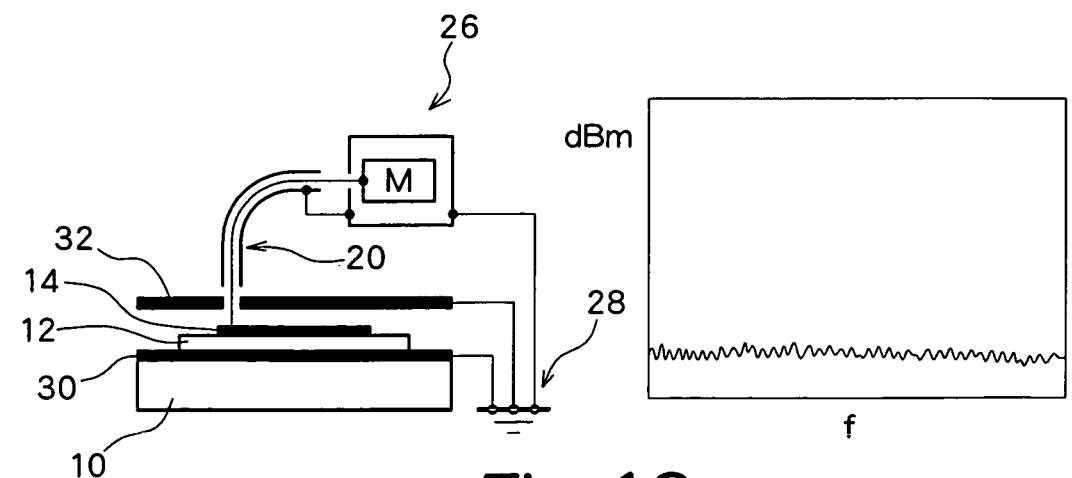

A preferred embodiment of the present invention will be described with reference to the attached drawings. First of all, a principle of the present invention will be described with reference to the results of modeling tests. Next, a practical configuration of a probing apparatus according to the preferred embodiment of the present invention will be described. FIGS. 1A to 1C are views respectively showing a configuration of a modeling test and measured ambient noise. The modeling test is for checking the effect of the ambient noise on a device of an insulated substrate. To perform the modeling test, as shown in the left portions of FIGS. 1A to 1C, a hard vinyl chloride plate 12 is disposed on an insulating resin table 10. Further, a copper foil 14 is disposed on the vinyl chloride plate 12. The vinyl chloride plate 12, having a thickness of 1 mm, is a model of an insulated substrate. The copper foil 14, having a size of 5 mm×5 mm, is a model of a device. To measure the noise detectable from the copper foil 14, a shield cable, or a coaxial cable, 20 and a spectrum analyzer 26 are used. The shield cable 20 includes a core wire, or a center conductor, 16 having one end connected to the copper foil 14 and the other end connected to a measuring portion 22 of the spectrum analyzer 26. The measuring portion 22 of the spectrum analyzer 26 is a model of a measuring unit of a tester. A shield braid, or an outer conductor, 18 of the shield cable 20 is connected to a casing body of the spectrum analyzer 26. The casing body of the spectrum analyzer 26 is connected to a ground terminal 28.

A screen of the spectrum analyzer 26, shown in the right portion of FIG. 1A, has an X-axis representing frequency (f) and a Y-axis representing noise level (dBm). The measurement was performed in the frequency range from 0 Hz to 1 MHz. The Y-axis reaches 100 dB at its full scale, in increments of 10 dB/div. As is understood from the measurement result, the noise level that can be detected from the copper foil 14 is significantly large.

FIG. 1B shows another example that includes an iron plate 30 as a model of a metallic stage. The iron plate 30 is disposed beneath the hard vinyl chloride plate 12 serving as a model of an insulated substrate that has a thickness of 1 mm. The iron plate 30 is connected to the ground terminal 28. Components identical with those shown in FIG. 1A are denoted by the same reference numerals. The screen of the spectrum analyzer 26 shown in the right portion of FIG. 1B has the same scale as the screen of FIG. 1A. The measurement result of FIG. 1B shows that providing a conductor stage beneath the vinyl chloride plate (i.e. an insulated substrate) and connecting the conductor stage to the ground terminal brings about an effect of reducing the noise level by −20 dB or more.

FIG. 1C shows a further different example that includes a circuit substrate 32. The circuit substrate 32 has one side plane with an entire copper covering layer. And the copper layer of the circuit substrate 32 is positioned over to the copper foil 14. The copper layer of the circuit substrate 32 is opposed to the copper foil 14. The copper layer serves as a model of a shielding cover. The copper layer is connected to the ground terminal 28. The remainder of the configuration is identical with that of the FIG. 1B. The screen of the spectrum analyzer 26 shown in the right portion of FIG. 1C has the same scale as the screen of FIG. 1A. The measurement result of FIG. 1C shows that the noise level is further reduced by providing a conductive shielding cover over the copper foil (i.e. a device) and grounding the shielding cover. The noise level in this case is within a range of measurement error or system noise of the measurement.

As is apparent from the foregoing description, the above modeling tests have demonstrated that the noise level that can be detected from a copper foil is significantly large when the copper foil is disposed on a vinyl chloride plate serving as a model of a device disposed on an insulated substrate. On the other hand, when an iron plate serving as a model of a stage is grounded, the noise is greatly reduced. Moreover, when a copper layer of the circuit substrate serving as a model of a shielding cover entirely covers an upper surface of the copper foil and is grounded, the noise is further reduced. In the modeling tests of FIGS. 1B and 1C, a large-scale shielding facility capable of covering a whole measurement system, such as a shielding room or a shielding casing, is not required. The members required in this case are limited to a stage being grounded and a plate member having a copper layer entirely covering a copper foil serving as a model of a device. Therefore, the above modeling tests suggest that, a large scale shielding facility is not required for probing and measuring a micro signal or a low level signal.

Next, a practical probing apparatus according to a preferred embodiment of the present invention will be described.

In the following description, a measurement object of a micro signal is a liquid crystal display wiring pattern disposed on a glass substrate. Furthermore, the liquid crystal display can include circuit elements. The liquid crystal display of the embodiment is, for example, a sub-assemblied liquid crystal display or a complete-assemblied liquid crystal display. The liquid crystal display is, for example, of a passive type or an active type. Furthermore, the device of the embodiment is not limited to a device formed on a glass substrate, and therefore includes a device disposed on an insulated substrate, such as a device on an LSI wafer or an SOI (Silicon On Insulator) or a similar semiconductor device.

Furthermore, the numerical values representing the frequency, dimensions of a glass substrate and a device, or the like are mere examples. Any other numerical values can be used, so long as the following conditions for realizing a compact shielding cover are satisfied. Furthermore, a probe for inputting or outputting a signal to or from a measurement terminal of a device to measure the characteristics of the device is a contact-type probe having a plurality of probe needles. However, a non-contact-type probe can be also used. For example, high-frequency communications between the probe and the measurement terminal can be employed for the measurement of characteristics. The probe may be equipped with an optical sensor, and a portion performing optical measurement of a device can be used as a measurement terminal for the measurement of characteristics.

Figure 2:
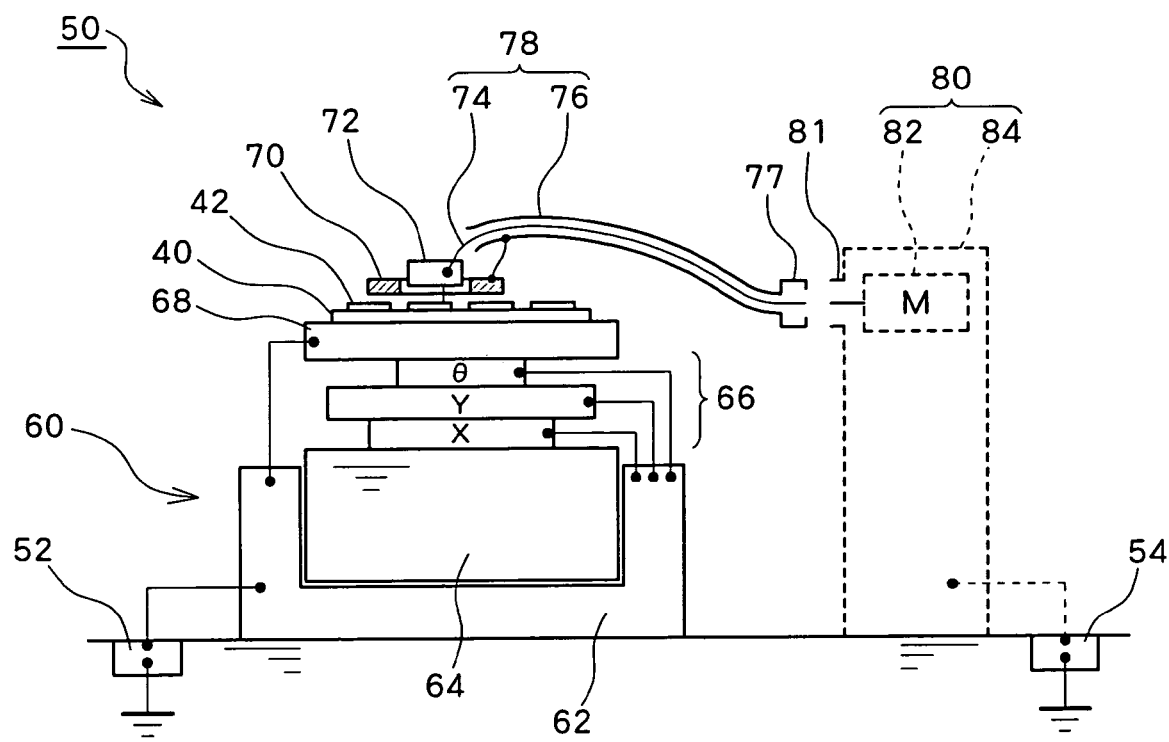
FIG. 2 is a view showing the arrangement of a probing apparatus and the vicinity thereof according to a preferred embodiment of the present invention.

FIG. 2 shows a practical arrangement of a probing apparatus 50. Besides constituent components of the probing apparatus 50, FIG. 2 shows a glass substrate 40 and a plurality of devices 42 disposed in a discrete fashion, that are spaced apart from each other, on the glass substrate 40, as measurement objects. Each device 42 has wiring patterns of transparent electrodes that constitute parts of the liquid crystal display.

Furthermore, in addition to the constituent components of the probing apparatus 50, FIG. 2 shows a measuring apparatus 80 (indicated by a broken line) connected to the probing apparatus 50. The measuring apparatus 80 has the capability of measuring electric characteristics of the device 42 (i.e., measuring object). The measuring apparatus 80 consists of a measuring portion 82 and a casing body 84. The measuring portion 82 includes a measurement control circuit and a measuring circuit. The casing body 84 of the measuring apparatus 80 is connected to a ground terminal 54 via a conductive wire that is sufficiently thick and short. The probing apparatus 50 has the capability of probing a micro signal from an intended one of the devices 42 that are spaced apart from each other and disposed on the glass substrate 40. The probing apparatus 50 includes a stage 68 of a mechanism apparatus 60, a shielding cover 70 provided over the stage 68, a probe 72, and a signal cable 78. The signal cable 78 includes a connecting terminal 77 connected to the measuring apparatus 80.

In addition to the stage 68, the mechanism apparatus 60 includes a metallic base body 62, a vibration absorber 64 made of stone or the like, and a shifting mechanism 66, for moving the stage, mounted on the vibration absorber 64. The stage 68 is attached on the shifting mechanism 66. The shifting mechanism 66 can shift the stage 68 in both X and Y directions and also rotate the stage 68 about the Z-axis (referred to as θ rotation). Furthermore, although not shown in the drawings, a control section for controlling the shifting mechanism 66 is provided. The control section is connected to the measuring apparatus 80 via a signal line, so that the mechanism apparatus 60 and the measuring apparatus 80 can work cooperatively.

The shifting mechanism 66 has a metallic portion via which the shifting mechanism 66 is connected to the base body 62. The base body 62 is connected to a ground terminal 52 via a conductive wire that is sufficiently thick and short. The reason why the shifting mechanism 66 is connected via the base body 62 to the ground terminal 52 is that the base body 62 is a large metallic block that has very low electric resistance as compared with a conductive wire. If any other means having a smaller electric resistance is available, the shifting mechanism 66 can be directly connected to the ground terminal 52 without depending on an electric path including the base body 62. Needless to say, the ground terminal 54 for the measuring apparatus 80 and the ground terminal 52 for the mechanism apparatus 60 can be provided as a common ground terminal.

The stage 68 of the mechanism apparatus 60 has the capability of holding or supporting the glass substrate 40 (i.e., measurement object). The shifting mechanism 66 operates to cause the glass substrate 40 mounted on the stage 68 to shift to an arbitrary position or in an arbitrary direction. The stage 68 is a flat plate table, having a metallic layer at least provided on a flat upper surface. The metallic layer of the stage 68 is connected to the base body 62 via a short and thick wire that allows the stage 68 to shift freely within a predetermined shift range. In other words, in consideration of the arrangement of the mechanism apparatus 60, it is desirable to select an electric path having the lowest electric resistance to connect the stage 68 to the ground terminal 52.

The probe 72, which is positioned over the stage 68 of the mechanism apparatus 60, has the capability of inputting or outputting a measuring signal to or from the device 42 with probe needles contacting with measurement terminals of the device 42. When the device 42 has a plurality of measurement terminals, the probe 72 should have a plurality of probe needles. The probe 72 is connected to a connecting terminal 81 of the measuring apparatus 80 via the signal cable 78. The signal cable 78 has the connecting terminal 77 connected to the connecting terminal 81 of the measuring apparatus 80.

The signal cable 78 includes a core wire 74 transmitting a signal, and a shield braid 76 electromagnetically shielding the core wire 74. The core wire 74 has one end connected to a probe needle of the probe 72 and the other end connected via a signal line of the connecting terminal 77 to the measuring portion 82 of the measuring apparatus 80. The shield braid 76 is connected via a casing of the connecting terminal 77 to the casing body 84 of the measuring apparatus 80. In other words, the shield braid 76 is connected to the ground terminal 54 via the casing body 84 of the measuring apparatus 80. The reason why such an electric path is selected is because the casing body 84 of the measuring apparatus 80 is a large metallic casing and accordingly has an electric resistance lower than that of a conductive wire. However, when any other connecting means having a smaller electric resistance is available, the shield braid 76 can be directly connected to the ground terminal 54 or the ground terminal 52 without depending on the electric path including the casing body 84 of the measuring apparatus.

The shielding cover 70, positioned over the stage 68 of the mechanism apparatus 60 and provided around the probe 72, is an electromagnetic shielding plate having the capability of eliminating adverse effect of external noises during measurement for a micro signal of the measured device 42. More specifically, the shielding cover 70 is substantially parallel to an upper surface of the stage 68. The glass substrate 40 mounting the devices 42 thereon is disposed between the shielding cover 70 and the stage 68. The shielding cover 70 is constructed from a metallic plate. A lower surface of the shielding cover 70 is spaced with a predetermined gap from the devices 42 on the glass substrate 40, so that the shielding cover 70 is not brought into direct contact with the devices 42. Alternatively, the shielding cover 70 can be constructed from a plate member that has a metallic layer provided on a surface opposing the upper surface of the stage 68. A metallic portion of the metallic plate or the metallic layer is connected to the shield braid 76 of the signal cable 78. Accordingly, the shielding cover 70 is connected via the casing body 84 of the measuring apparatus 80 to the ground terminal 54. Moreover, the metallic portion may be connected directly to the ground terminal 52.

Figure 3:
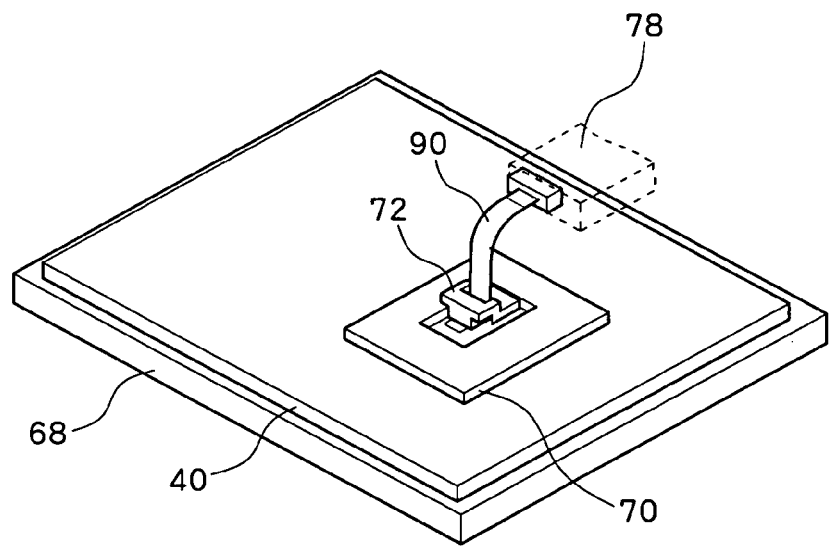
FIG. 3 is a perspective view showing a probe and the vicinity thereof according to the preferred embodiment of the present invention.
Figure 4:
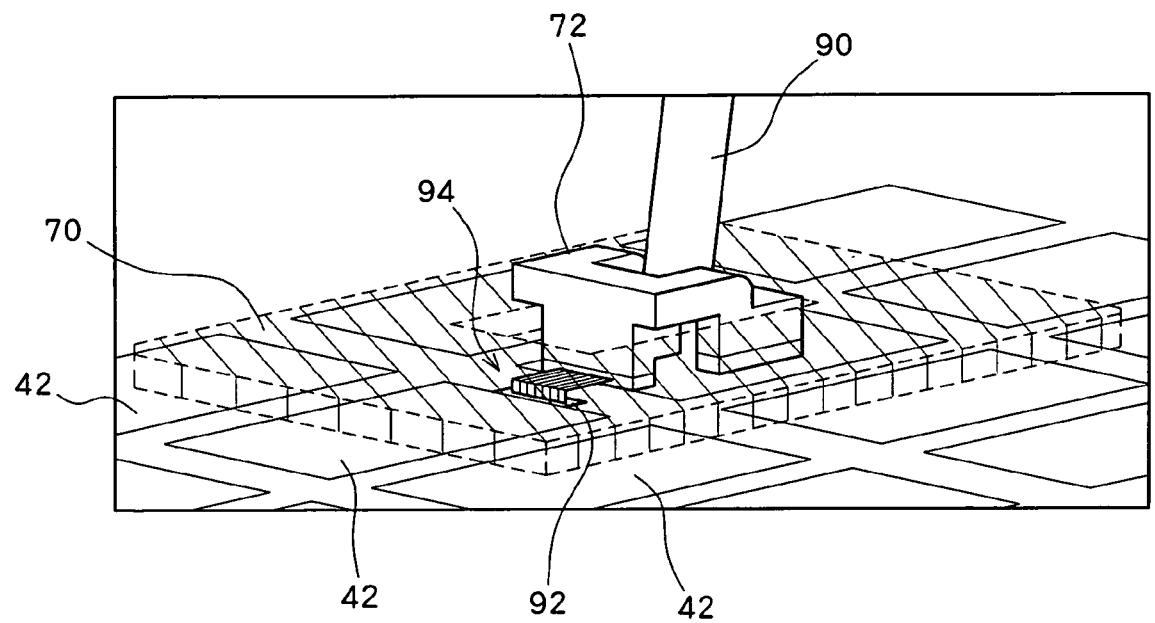
FIG. 4 is an enlarged view showing a positional relationship between the probe and a device according to the preferred embodiment of the present invention, in which a broken line shows a shielding cover.

FIG. 3 is a perspective view showing the probe 72 and the vicinity thereof. FIG. 4 is an enlarged view showing a positional relationship between the probe 72 and the devices 42, in which a broken line shows the shielding cover 70. As is understood from FIGS. 3 and 4, the device 42 has a plurality of measurement terminals 92, and the probe 72 has corresponding probe needles 94. According to an example shown in FIG. 4, the measurement terminals 92 are shown as a terminal region, because they have smaller dimensions as compared with the main body of the device 42.

The probe needles 94 are attached to the main body of the probe 72 so that distal ends of the respective probe needles 94 can be brought into contact with the measurement terminals 92. The probe needles 94 are conductive needles that are electrically isolated from each other. For example, the probe needles 94 can be constructed from a plurality of bent needles attached to the main body of the probe 72. Furthermore, the probe needles 94 can be constructed from a plurality of looped wires having proximal ends embedded in the main body of the probe 72 and distal ends protruding from the main body of the probe 72 and configured into needles. As a practical example, a so-called probe card can be used as the probe 72 equipped with the probe needle 94.

A flexible substrate 90 is a flexible insulated substrate having a wiring pattern of a plurality of conductors formed thereon. The flexible substrate 90 has the capability of interconnecting signals between the probe 72 and the signal cable 78. More specifically, the signal cable 78 includes a plurality of the core wires 74, which are mutually isolated with appropriate insulating material. And the shield braid 76 of the signal cable, serving as an electromagnetic shielding member, entirely covers the core wires 74. Furthermore, an insulating member is used as a sheath of the signal cable 78. Thus, the signal cable 78 is heavy in weight and poor in flexibility. This is the reason why the flexible substrate 90 is provided between the probe 72 and the signal cable 78. The flexible substrate 90 allows relatively free movement of the probe 72 that is brought into contact with the device 42 or removed from the device 42. One end of each conductor pattern on the flexible substrate 90 is connected to a rear end of one of a plurality of probe needles 94. The other end of each conductor pattern on the flexible substrate 90 is connected to one of a plurality of core wires 74 of the signal cable 78.

Figure 5:
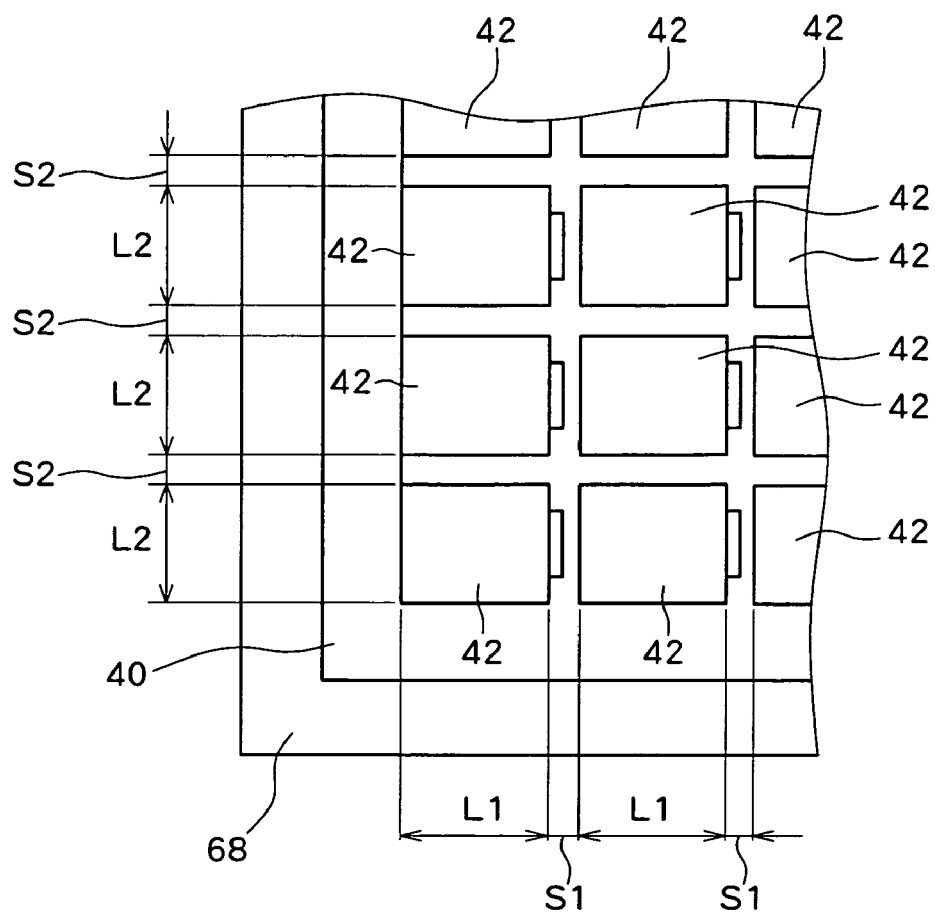
FIG. 5 is a plan view showing devices disposed in a matrix pattern on a glass substrate according to the preferred embodiment of the present invention.
Figure 6:
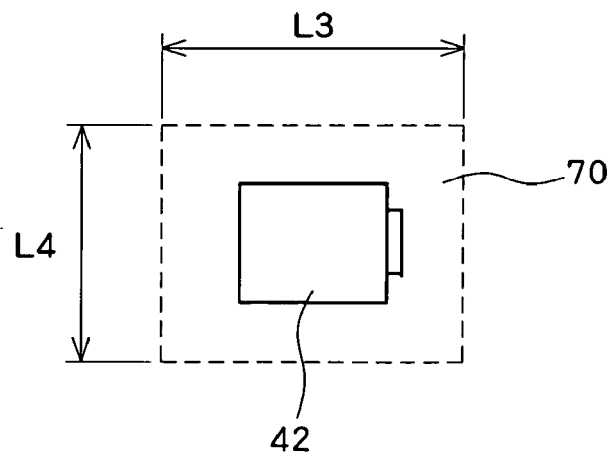
FIG. 6 is a plan view showing a relationship between the size of a shielding cover and the size of a device according to the preferred embodiment of the present invention.

FIG. 5 shows the devices 42 disposed in a matrix pattern on the glass substrate 40. FIG. 6 shows a relationship between the size of the shielding cover 70 and the size of the device 42. Each device 42 has dimensions of L1 (lateral direction)×L2 (longitudinal direction). Mutually adjacent devices 42 are spaced with a clearance S1 in the lateral direction and a clearance S2 in the longitudinal direction. For example, the glass substrate 40 has dimensions of 1 m (lateral direction)×1.4 m (longitudinal direction). Each device 42 has dimensions of L1=50 mm and L2=40 mm. The clearances S1 and S2 are 5 mm (i.e., S1=S2=5 mm). The device 42 having the above dimensions corresponds to a standard liquid crystal display applicable, for example, to a mobile phone. The thickness of the device 42 is generally represented by a patterning thickness. A practical value of the thickness is, for example, 3 μm.

The shielding cover 70 of the probing apparatus 50 has the following functions.

First, the relationship between the shielding cover 70 and the device 42 for enabling measurement of a micro signal is described. More specifically, the size of the shielding cover 70 preferable for measurement of the micro signal of the device 42 having the above-described dimensions and layout will be described.

As described in the principle of the present invention, three kinds of noise give adverse effect to the micro signal measurement of the device 42: noise coming from neighboring devices 42; noise coming from a driving apparatus of the mechanism apparatus 60; and ambient noise coming from above.

According to the devices 42 having the above-described dimensions and thickness, the noise coming from neighboring devices 42 is sufficiently small as compared with the ambient noise and is accordingly negligible.

Next, the noise coming from the mechanism apparatus 60 can be sufficiently suppressed by securely connecting the stage 68 to the ground terminal 52. Therefore, as described with reference to FIG. 2, the stage 68 is desirably connected via a short wire allowing a shifting movement of the stage 68 to the base body 62 connected to the ground terminal 52. The ambient noise coming from above can be sufficiently suppressed by securely connecting the shielding cover 70 to the ground terminal 54. In other words, the shielding cover 70 is desirably maintained at the ground potential.

As described above, the present embodiment is characterized by connecting the shielding cover 70 to the ground terminal 54 or to the ground terminal 52, forming a shielding gap between parallel flat plates (i.e., between the shielding cover 70 and the stage 68, which are both connected to the ground terminal), and disposing a measured device 42 in the shielding gap. The configuration of this embodiment enables elimination of an over-side spatial coupling with respect to the measured device 42 and suppressing adverse effects of the external noises during the micro signal measurement of the device 42. In this case, the shielding cover 70 should have a sufficiently large size so as to be capable of entirely covering the measured device 42. Because, an electric line of force is an arc line bending inward at an edge or peripheral opening of the shield structure consisting of parallel flat plates.

To prevent the above drawbacks, the shielding cover 70 should have a wider width, as is known in relation to a micro strip line and a strip line. Preferably, the shielding cover 70 should have a grounded area whose width is approximately two times the width of each device.

FIG. 6 shows a relationship between the size of the device 42 and the size of the shielding cover 70. In a case where the shielding cover 70 has dimensions of L3×L4, minimum conditions that should be satisfied are L3=L1 and L4=L2. In addition, as is known in relation to the micro strip line or the strip line, it is desirable to satisfy the conditions L3=2×L1 and L4=2×L2. Furthermore, a positional relationship between the probe 72 and the shielding cover 70 should be optimized in consideration of the position of a measuring terminal of the device 42 so that the positional relationship shown in FIG. 6 can be realized. When the device 42 has a shape other than a rectangle, the shielding cover desirably has an opposing area that is preferably 4 times large for the area of a measured device on the insulated substrate.

According to the above-described example, the shielding cover 70 has a size of 100 mm×80 mm or more and the size is accordingly very small as compared with that of the glass substrate 40. Therefore, the above-described embodiment enables probing of a micro signal from a device without using a large-scale shielding facility shielding the entire body of the probing apparatus 50.

As described above, the shielding cover has an area not smaller than the device and preferably 4 times that of the device. The shielding cover and the stage, which are both grounded, cooperatively form a shielding gap consisting of parallel flat plates. The device is disposed in the shielding gap. Thus, the above-described embodiment can suppress adverse effects of external noises during measurement of a micro signal performed for each device on a substrate.

Although the present invention has been described with reference to an exemplary embodiment, it is to be understood that the invention is not limited to the disclosed exemplary embodiment. The scope of the following claims is to be accorded the broadest interpretation so as to encompass all modifications, equivalent structures, and equivalent functions. This application claims priority from earlier Japanese Patent Application No. 2005-005611 filed, Jan. 12, 2005 which is hereby incorporated by reference herein in its entirety.

What is claimed is:

1. A probing apparatus for probing a micro signal from a measured device on an insulated substrate that mounts a plurality of devices spaced apart from each other, comprising:
 a stage defining an upper surface that supports a lower surface of the insulated substrate and is connected to a ground terminal, wherein the upper surface defines a first outer periphery;
 a probe that inputs or outputs a measuring signal to or from a measurement terminal of the measured device; and
 a shielding cover that is positioned over an upper surface of the measured device and is connected to the ground terminal, wherein the shielding cover forms a shielding gap between the shielding cover and the stage, the measured device is disposed in the shielding gap, the shielding cover has an opposed surface defining a second outer periphery, and a largest dimension of the second outer periphery is smaller than a smallest dimension of the first outer periphery.

2. The probing apparatus according to claim 1, wherein the shielding cover is a conductive shielding plate having a surface parallel to a surface of the stage.

3. The probing apparatus according to claim 1, wherein an electric potential of the ground terminal is identical with an electric potential of a metallic casing body that supports a driving unit of the stage.

4. The probing apparatus according to claim 1, wherein the measured device is a device including a transparent electrode disposed on the insulated substrate.

5. The probing apparatus according to claim 4, wherein the transparent electrode is an ITO electrode.

6. The probing apparatus according to claim 4, wherein the insulated substrate is a glass substrate.

7. A probing apparatus for probing a micro signal from a measured device on an insulated substrate that mounts a plurality of devices spaced apart from each other, comprising:
 a stage defining an upper surface that supports a lower surface of the insulated substrate and is connected to a ground terminal, wherein the upper surface defines a first outer periphery;
 a probe that inputs or outputs a measuring signal to or from a measurement terminal of the measured device; and
 a shielding cover that is positioned over an upper surface of the measured device and is connected to the ground terminal, wherein the shielding cover has an opposed surface defining a second outer periphery, and a largest dimension of the second outer periphery is smaller than a smallest dimension of the first outer periphery
 wherein an electric potential of the ground terminal is identical with an electric potential of a metallic casing body that supports a driving unit of the stage.

8. The probing apparatus according to claim 7, wherein the measured device is a device including a transparent electrode disposed on the insulated substrate.

9. The probing apparatus according to claim 7, wherein the insulated substrate is a glass substrate.

* * * * *